United States Patent
Chang et al.

(10) Patent No.: US 6,459,045 B1
(45) Date of Patent: Oct. 1, 2002

(54) PCB STRUCTURE FOR REGULATING CONSTANT POWER SOURCE AND STRENGTHENING GROUND CONNECTIONS

(75) Inventors: Nai-Shung Chang, Taipei Hsien (TW); Shu-Hui Chen, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/924,880

(22) Filed: Aug. 8, 2001

(30) Foreign Application Priority Data

Nov. 10, 2000 (TW) .......................................... 89123792

(51) Int. Cl.[7] ................................................ H05K 1/03
(52) U.S. Cl. ...................... 174/255; 174/261; 174/264; 361/785; 361/791; 361/793; 361/794
(58) Field of Search ................................. 174/255, 260; 361/792, 793, 794, 795, 780, 791, 785

(56) References Cited

U.S. PATENT DOCUMENTS

| | | | | | |
|---|---|---|---|---|---|
| 4,498,122 A | * | 2/1985 | Rainal | .......................... | 361/414 |
| 4,799,128 A | * | 1/1989 | Chen | ........................... | 361/414 |
| 5,191,174 A | * | 3/1993 | Chang et al. | ................ | 174/266 |
| 5,410,107 A | * | 4/1995 | Schaper | ...................... | 174/255 |
| 5,841,686 A | * | 11/1998 | Chu et al. | ..................... | 365/51 |
| 6,229,095 B1 | * | 5/2001 | Kobayashi | .................. | 174/255 |

\* cited by examiner

*Primary Examiner*—Kamand Cuneo
*Assistant Examiner*—Jose H. Alcala
(74) *Attorney, Agent, or Firm*—J.C. Patents (57) ABSTRACT

A circuit sub-board for regulating constant power source and strengthening ground connections. The circuit sub-board is a double-layered printed circuit board having a large surface power-source layer and a ground-connection layer. The circuit sub-board is utilized to cover the insufficiently ground-covered main board signaling lines as well as insufficiently ground-connected power and ground signaling lines on the main board. With the installation of the circuit sub-board, signals can be transmitted more reliably and with less interference.

9 Claims, 7 Drawing Sheets

PCB STRUCTURE FOR REGULATING CONSTANT POWER SOURCE AND STRENGTHENING GROUND CONNECTIONS

CROSS-REFERENCE TO RELATED APPLICATION

This application claims the priority benefit of Taiwan application serial no. 89123792, filed Nov. 10, 2000.

BACKGROUND OF THE INVENTION

1. Field of Invention

The present invention relates to the main board of a computer system. More particularly, the present invention relates to a computer main board structure for regulating constant power source.

2. Description of Related Art

Due to the rapid progress in semiconductor fabrication technologies, powerful central processing units (CPUs) capable of executing billions of instructions per second are constructed. Consequently, most recent personal computers operate at a bus speed related to the processor clock rate progressing in the gigahertz (GHz) frequency range. Even computer peripheral products can perform at a speed that parallels the CPU.

As the early computer system, the operating frequency is much lower than nowadays. Hence, signal reception for these types of computers are rarely affected by weak ground connections or an unstable voltage supply. However, the recent computer generally operates at a bus speed related to the processor clock rate progressing in the gigahertz frequency range. And the printed circuit board of the recent computer presents highly tight squeeze layout leg and outlet legs that requires a pierce-hole method to transmit signals from the top layer to the bottom layer. Consequently, producing an extensive ground layer or a power-source layer on a computer main board is almost impossible. Due to differences in power source and ground connection areas, signal received by the top signal layer and the bottom signal layer is bound to be unstable.

However, a printed circuit board with four layers is the most cost-effective means of production at present. Hence, a circuit board capable of regulating constant power source, strengthening ground connections, protecting signal integrity during transmission and shielding out external electromagnetic interference is in great demand.

SUMMARY OF THE INVENTION

Accordingly, one object of the present invention is to provide a circuit board and circuit sub-board capable of regulating constant power source and strengthening ground connections without increasing surface or volume of a main board so that the first and the fourth signaling layers on the main board are almost identical and that the cost of manufacture remains low.

To achieve these and other advantages and in accordance with the purpose of the invention, as embodied and broadly described herein, the invention provides a circuit sub-board that can be applied to a computer system for regulating constant power sources and strengthening ground connections. The computer system includes a main board. The main board further includes a first power-source hole, a first ground-connection hole, a first power-source layer and a first ground-connection layer. The circuit sub-board includes a printed circuit board. The printed circuit board further includes a second power-source layer and a second ground-connection layer. The second power-source layer has second power-source holes and the second ground-connection layer has second ground-connection holes. The printed circuit board can be a double-layered circuit board, for example. The printed circuit board serves to stabilize voltage and strengthen ground connections. The second power layer is electrically connected to the first power-source hole via the second power-source hole. Hence, the first power-source layer is connected to the main board and the second ground-connection hole is above the printed circuit board. The second ground-connection layer is electrically connected to the first ground-connection hole via the second ground-connection hole so that the first ground layer of the main board is connected. The circuit sub-board is actually attached to the main board. In this invention, regions on the main board that corresponds to various components are excavated so that the circuit sub-board can attach to the main board. In addition, the second ground-connection layer is closer to the main board than the second power-source layer. Although power source stabilizing and ground-connection strengthening effects are weaker when the second power-source layer is closer to the main board, the effects are present nonetheless.

According to the embodiment of this invention, the structure formed by attaching the aforementioned circuit sub-board to the main board is achieved by piercing a plurality of guiding legs through the first power-source holes and the second power-source holes as well as piercing through the first ground-connection holes and the second ground-connection holes. The computer system further includes a chipset and a memory module slot. The circuit sub-board is in such a shape that most of the signaling lines between the chipset and the memory module slot are covered. Because the fourth signaling layer is electrically connected with and close to the circuit sub-board, this is equivalent to increasing the surface area of the ground connections and power source. Hence, the signaling lines are in a stable environment shielded from external electromagnetic interference.

This invention also provides a circuit board structure that can be applied to a computer system for regulating constant power sources and strengthening ground connections. The computer board structure includes a main board. The main board further includes a first printed circuit board, a first power-source layer, a first ground-connection layer, first power-source holes and first ground-connection holes. The first power-source holes are electrically connected to the first power-source layer. The first ground-connection holes are electrically connected to the first ground-connection layer and a circuit sub-board. The circuit sub-board serves to stabilize voltage. The printed circuit sub-board, for example, can be a double-layered circuit board such as a second printed circuit board having a second power-source layer and a second ground-connection layer. The second power-source layer has second power-source holes. The second ground-connection layer has second ground-connection holes and is above the second printed circuit board. The second power-source layer is electrically connected to the first power-source holes via the second power-source holes. The second ground-connection holes are above the second printed circuit board. The second ground-connection layer is electrically connected to the first ground-connection holes via the second ground-connection holes. The circuit sub-board is actually attached to the main board. Regions on the main board that corresponds to various components are excavated so that the circuit sub-board can attach to the main board. In addition, the second ground-connection layer is closer to the main board than the second power-source layer. Although power source stabilizing and ground-connection strengthening effects are weaker when the second power-source layer is closer to the main board, the effects are present nonetheless.

According to the embodiment of this invention, the structure formed by attaching the aforementioned circuit sub-board to the circuit board structure is achieved by piercing a plurality of guiding legs through the first power-source holes and the second power-source holes as well as the first ground-connection holes and the second ground-connection holes. The computer system further includes a chipset and a memory module slot. The circuit sub-board is in such a shape that most of the signaling lines between the chipset and the memory module slot are covered. Because the fourth signaling layer is electrically connected with and close to the circuit sub-board, this is equivalent to increasing the surface area of the ground connections and power source. Hence, the signaling lines are in a stable environment shielded from external electromagnetic interference.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
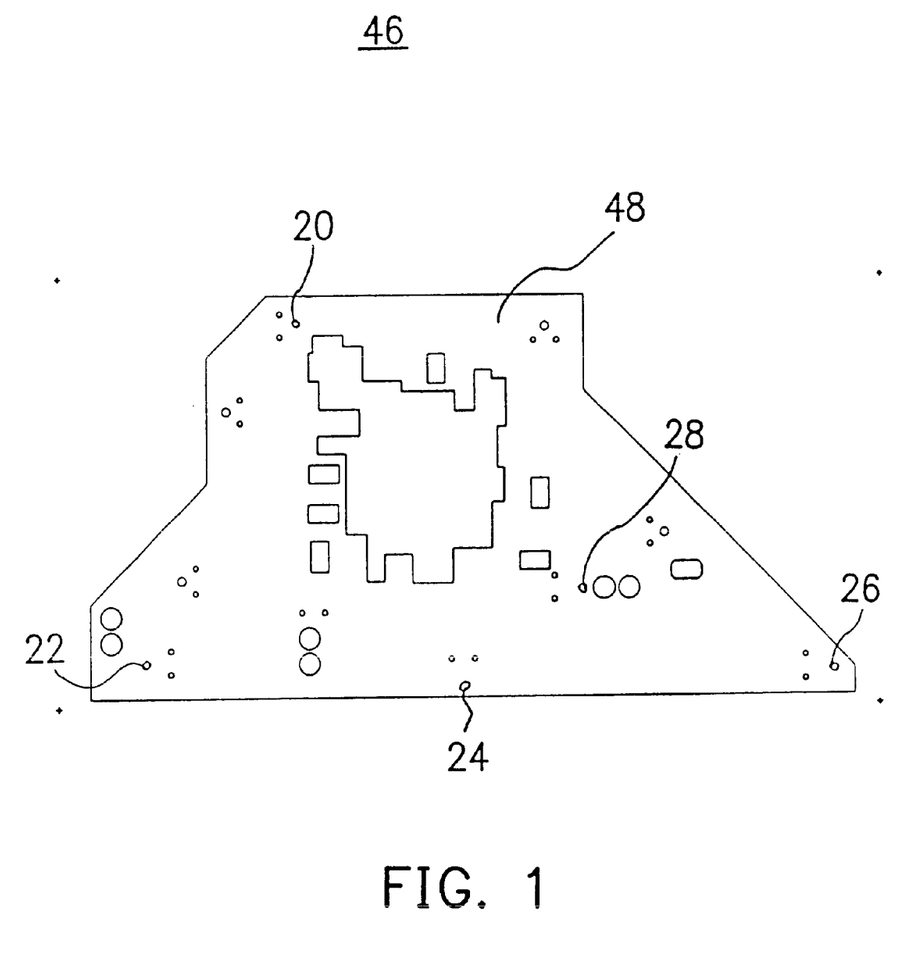
FIG. 1 is a sketch of the power-source layer on a circuit sub-board for regulating constant power source and strengthening ground connections according to one preferred embodiment of this invention.
Figure 2:
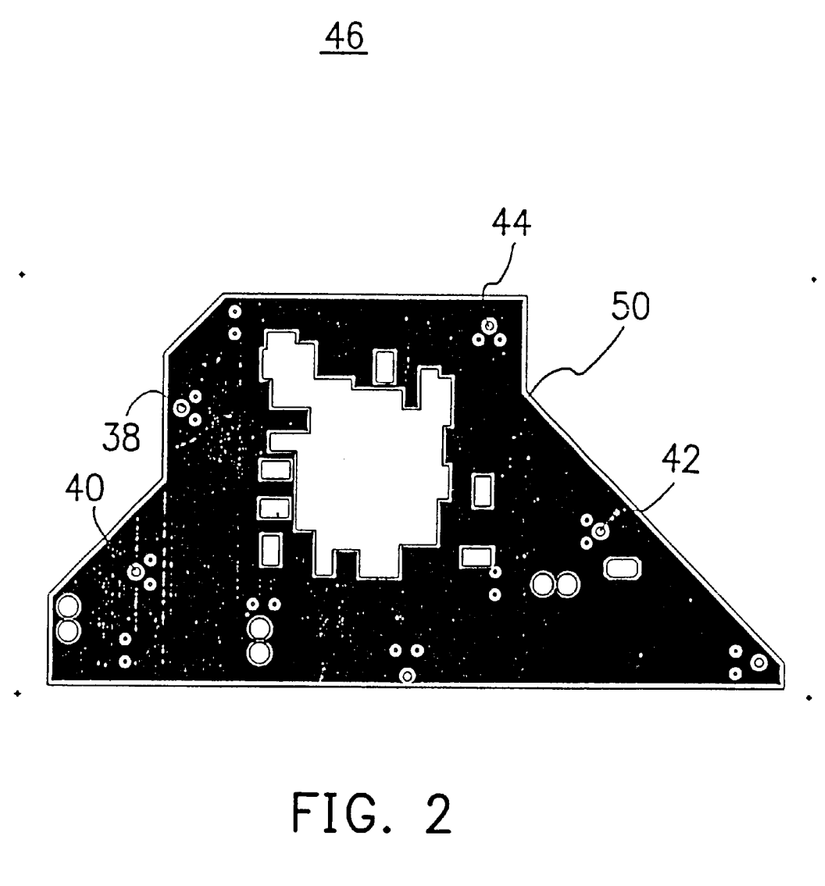
FIG. 2 is a sketch of the ground-connection layer on the circuit sub-board shown in FIG. 1.
Figure 3:
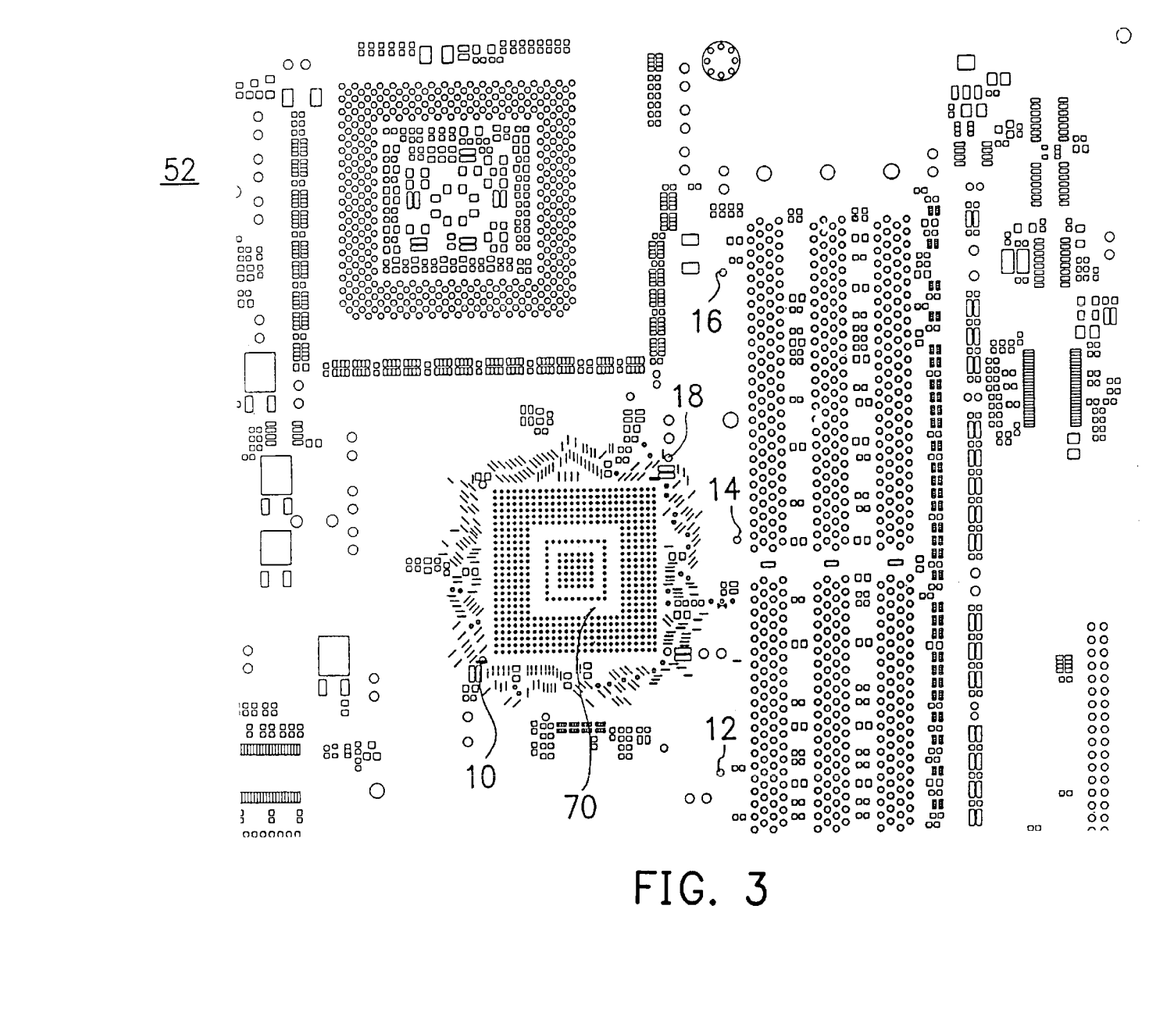
FIG. 3 is a sketch showing locations of components on the first layer of a main board that are used together with the circuit sub-board of this invention.
Figure 4:
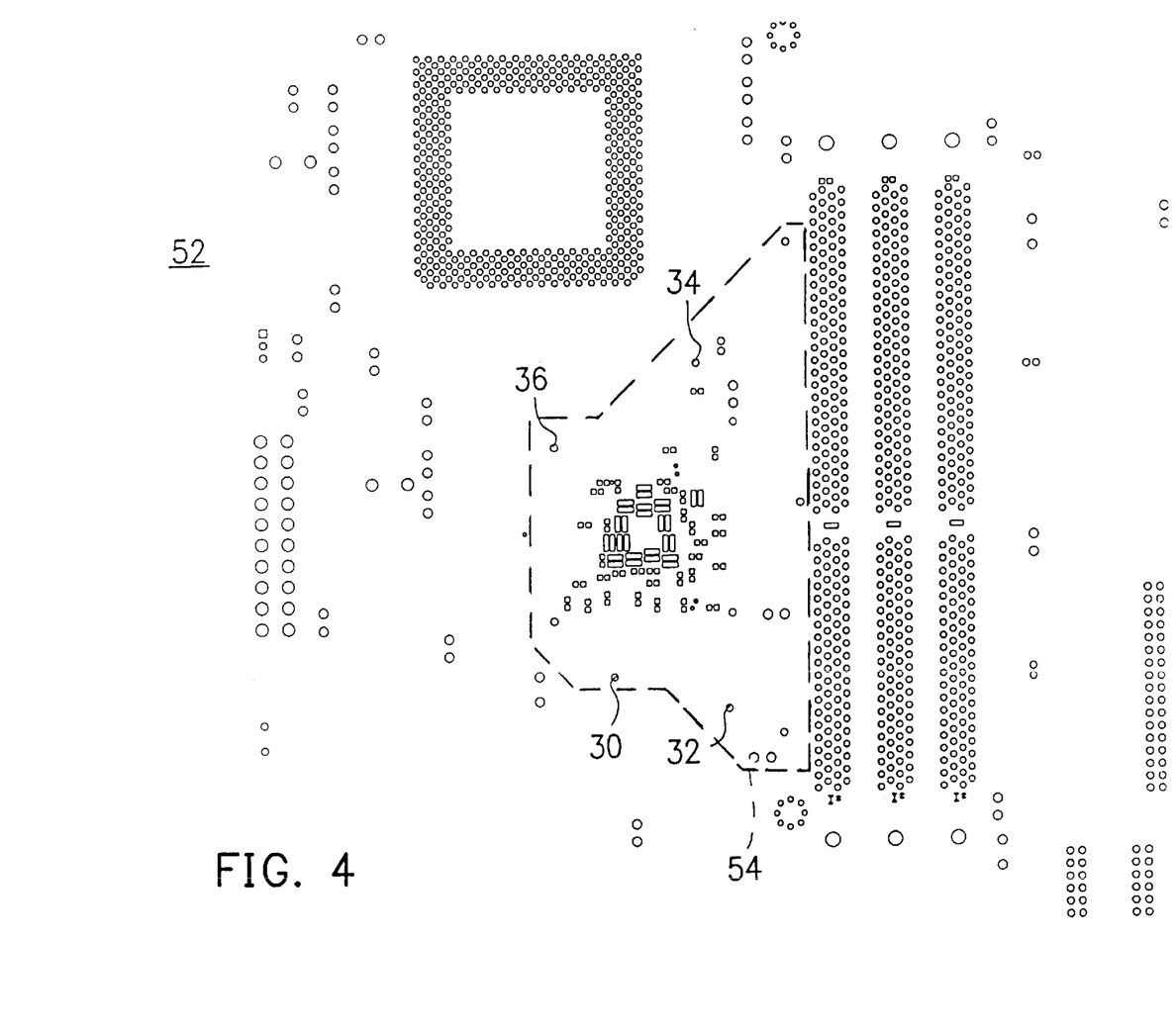
FIG. 4 is a sketch showing locations of components on the fourth layer of the main board shown in FIG. 3.
Figure 5:
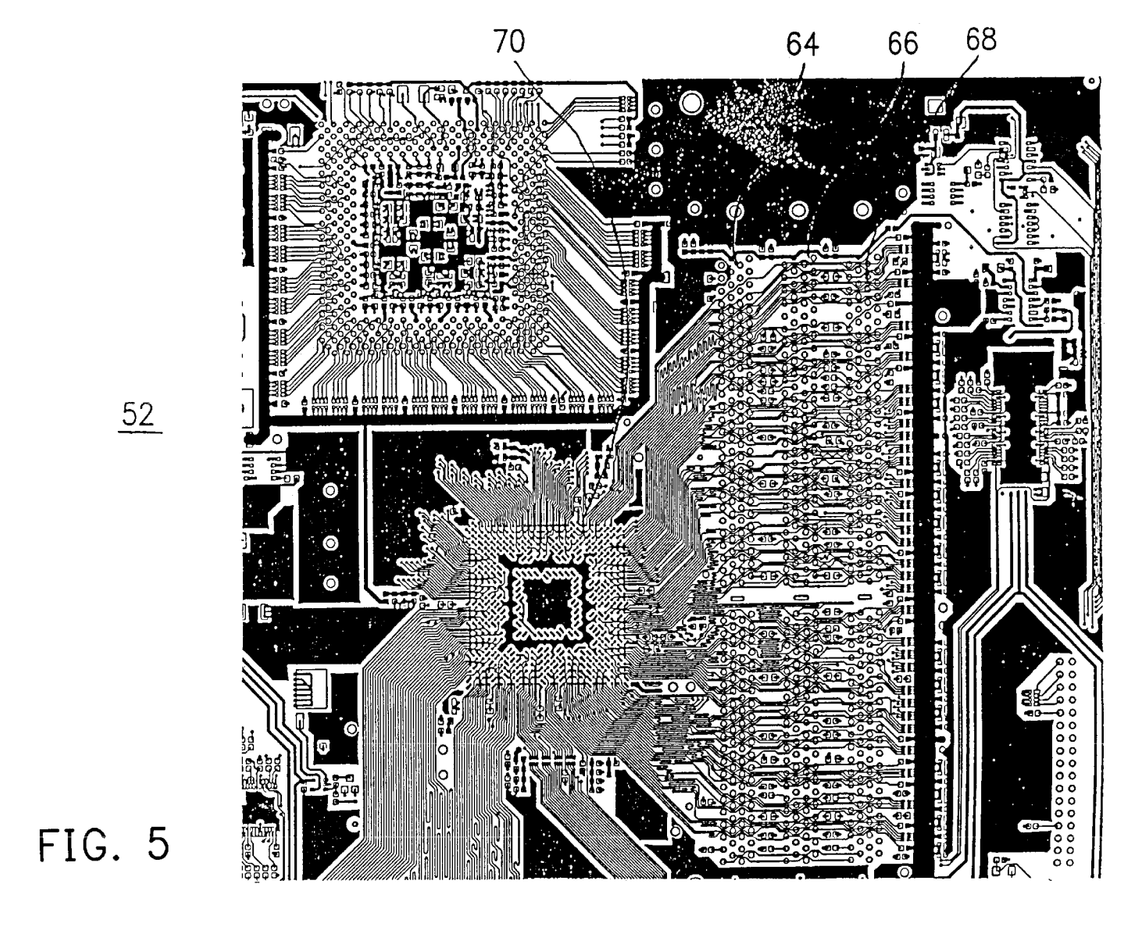
FIG. 5 is a sketch showing a portion of the layout design for the main board components shown in FIG. 3.
Figure 6:
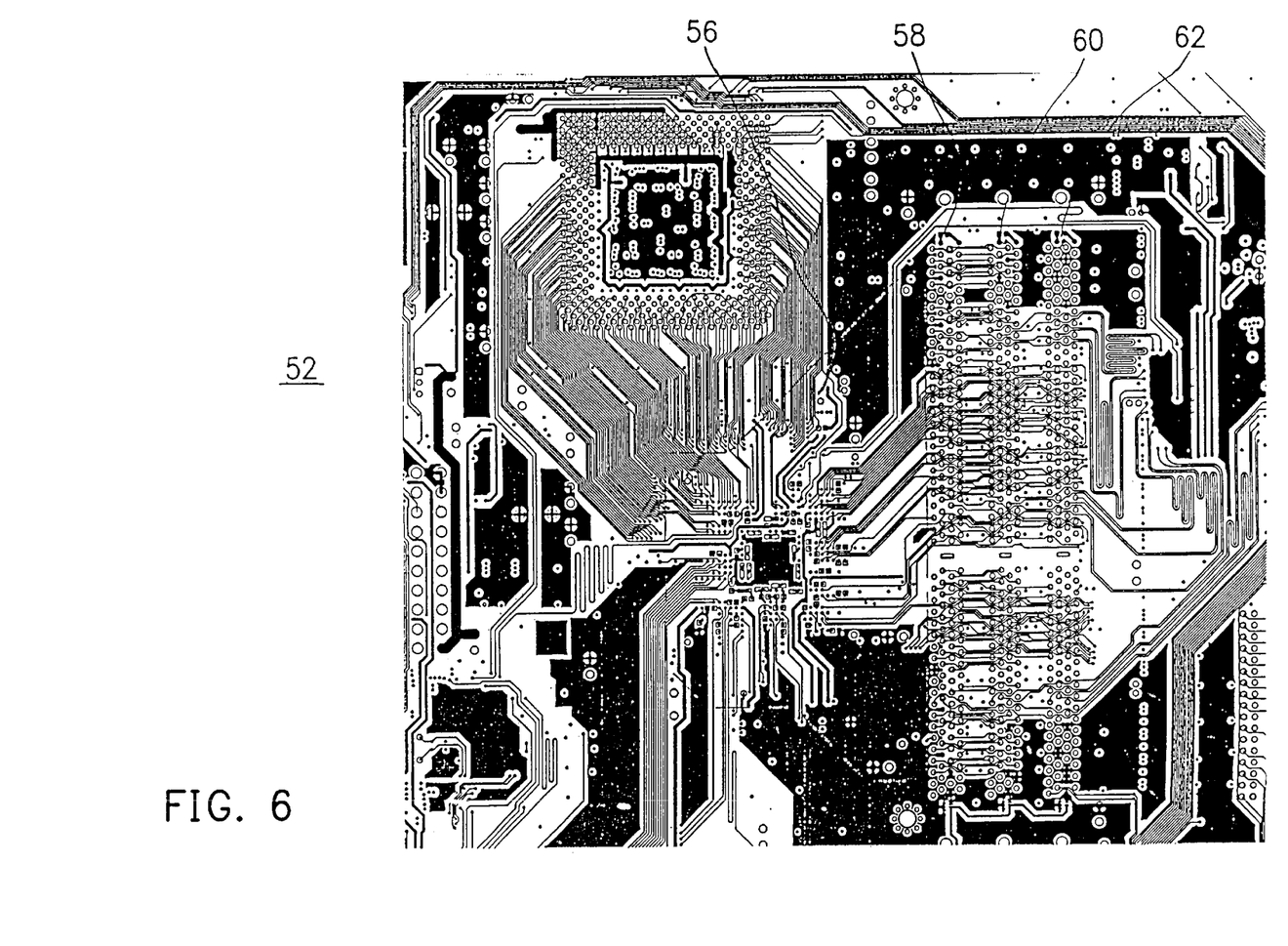
FIG. 6 is a sketch showing a portion of the layout design at the backside of the main board shown in FIG. 3.
Figure 7:
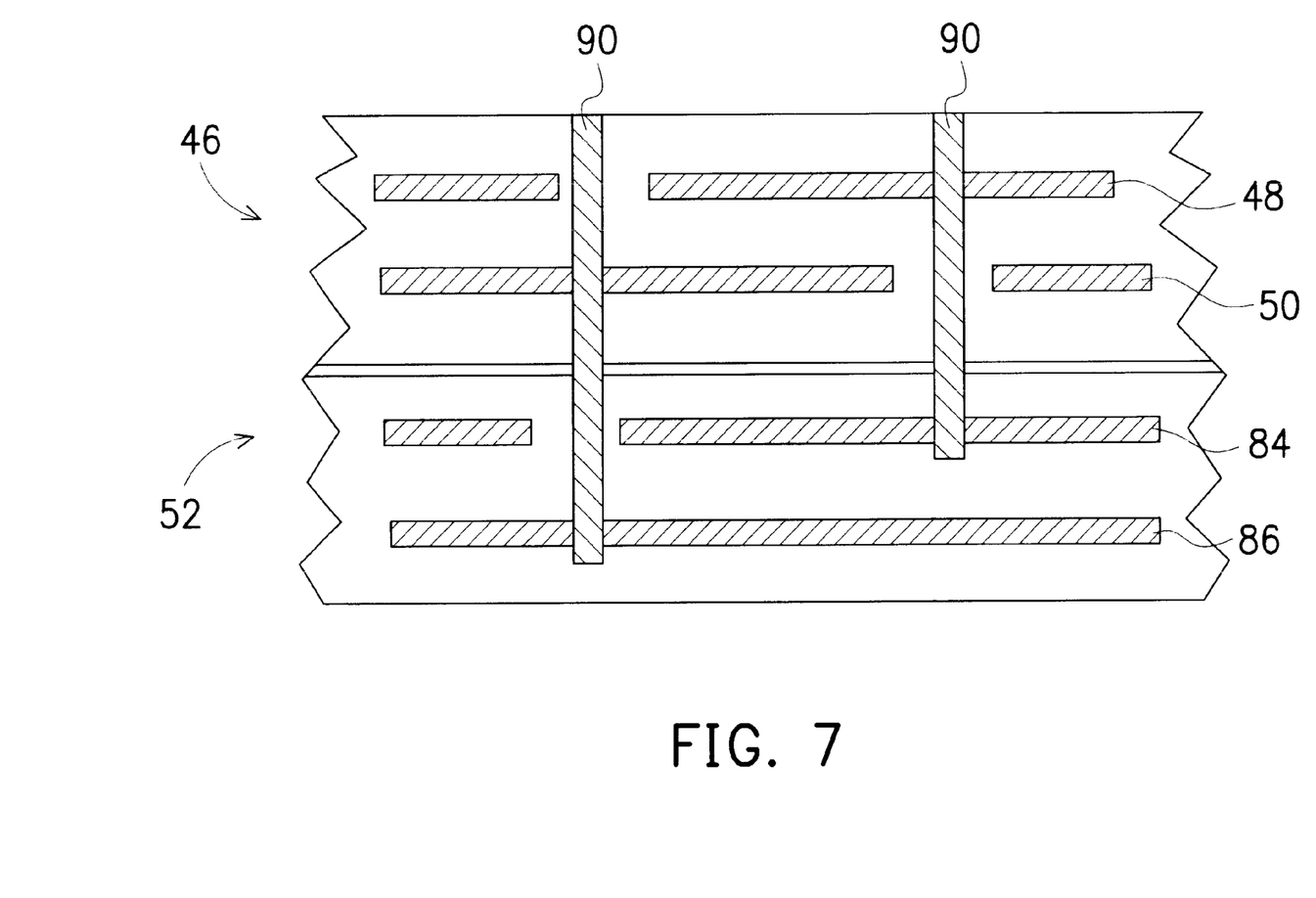
FIG. 7 is a sketch showing a section of the sub-board and the main board electrically connected according to an embodiment of the invention.

FIGS. 1 through 7 are schematic sketches showing circuit sub-board structures, associated main board structures and their corresponding layouts for regulating constant power source and strengthening ground connections according to an embodiment of the invention. As shown in FIGS. 1 through 7, the circuit sub-board 46 for regulating constant power source and strengthening ground connections can be applied to a computer system. The computer system includes a main board 52. The main board 52 further includes first power-source holes 10, 12 14, 16, 18, first ground-connection holes 30, 32, 34, 36, a first power-source layer and a first ground-connection layer. The circuit sub-board 46 includes a printed circuit board. The printed circuit board includes a second power-source layer 48 and a second ground-connection layer 50. The second power-source layer 48 has second power-source holes 20, 22, 24, 26 and 28. The second ground-connection layer 50 has second ground-connection holes 38, 40, 42 and 44. The printed circuit board 46 can be a double-layered circuit board, for example. The printed circuit board 46 serves to stabilize voltage and strengthen ground connections. The second power-source layer 48 is electrically connected to the first power-source holes (10, 12, 14, 16 and 18) via the second power-source holes (20, 22, 24, 26 and 28). Hence, the first power-source layer of the main board 52 is connected. The second ground-connection holes 38, 40, 42 and 44 are above the printed circuit board 46. The second ground-connection layer 50 is electrically connected to the first ground-connection holes (30, 32, 34 and 36) via the second ground-connection holes (38, 40, 42 and 44). Hence, the first ground-connection layer of the main board is connected. Portions of the main board 52 that corresponds to various electrical devices on the circuit sub-board 46 are excavated to prevent any electrical connection. Alternatively, instead of excavating the main board 52, an insulating material such as insulating paint may be painted over the electrical devices on the main board 52. The paint serves as electrical isolation for the circuit sub-board 46 so that the circuit sub-board 46 can actually attach to the main board 52. The circuit sub-board 46 is electrically connected to the main board 52 in such a manner that the second ground connection layer 50 faces the main board 52 and is closer to the main board 52 than the second power source layer. However, even if the second power source layer 48 of the circuit sub-board 46 is closer to the main board 52, power source stabilizing and ground connection strengthening effects are still present, although not as good as when the second ground connection layer 50 is closer to the main board 52.

According to the embodiment of this invention, the structure formed by attaching the aforementioned circuit sub-board 46 to the main board 52 is achieved by piercing a plurality of guiding legs through the first power-source holes 10, 12, 14, 16, 18 and the second power-source holes 20, 22, 24, 26, 28 as well as piercing through the first ground-connection holes 30, 32, 34, 36 and the second ground-connection holes 38, 40, 42, 44. These guiding legs not only serve as a medium of connection and piercing, but also serve as a tool for securing the circuit sub-board 46. The computer system further includes a chipset 70 and memory module slots 58, 60, 62, 64, 66 and 68. The circuit sub-board 46 has such a shape that most of the signaling lines between the chipset 70 and the memory module slots 58, 60, 62, 64, 66 and 68 are covered as shown by labels 54 and 56 in the FIGS. 4 and 5. Because the fourth signaling layer is electrically connected with and close to the circuit sub-board 46, this is equivalent to increasing the surface area of the ground connections and power source. Hence, the signaling lines are in a stable environment shielded from external electromagnetic interference.

This invention also provides a circuit board structure for regulating constant power source and strengthening ground connections that can be applied to a computer system. The circuit board structure includes a main board 52. The main board 52 further includes a first printed circuit board, a first power-source layer, a first ground-connection layer, first power-source holes 10, 12, 14, 16, 18 and first ground-connection holes 30, 32, 34, 36. The first power-source holes 10, 12, 14, 16, 18 are electrically connected to the first power-source layer. The first ground-connection holes 30, 32, 34, 36 are electrically connected to the first ground-connection layer. The circuit board structure also includes a circuit sub-board 46. The circuit sub-board 46 serves to stabilize voltage. The circuit sub-board 46 can be a double-layered circuit board, for example. The circuit sub-board 46 is a second printed circuit having a second power-source layer 48 and a second ground-connection layer 50. The second power-source layer 48 has second power-source holes 20, 22, 24, 26 and 28. The second ground-connection layer 50 has second ground-connection holes 38, 40, 42, 44 above the second printed circuit board. The second power-source layer 48 is electrically connected to the first power-source holes (10, 12, 14, 16 and 18) via the second power-source holes (20, 22, 24, 26 and 28) above the second printed circuit board. The second ground-connection layer 50 is electrically connected to the first ground-connection holes (30, 32, 34 and 36) via the second ground-connection holes (38, 40, 42 and 44). Portions of the main board 52 that corresponds to various electrical devices on the circuit sub-board 46 are excavated to prevent any electrical connection. Alternatively, instead of excavating the main board 52, an insulating material such as insulating paint may be painted over the electrical devices on the main board 52. The paint serves as electrical isolation for the circuit sub-board 46 so that the circuit sub-board 46 can actually attach to the main board 52. The second ground connection layer 50 is closer to the main board 52 than the second power source layer. However, even if the second power-source layer 48 of the circuit sub-board 46 is closer to the main board 52, power source stabilizing and ground connection strengthening effects are still present, although not as good as when the second ground connection layer 50 is closer to the main board 52.

According to the embodiment of this invention, the structure formed by attaching the aforementioned circuit sub-board 46 to the main board 52 is achieved by piercing a plurality of guiding legs through the first power-source holes 10, 12, 14, 16, 18 and the second power-source holes 20, 22, 24, 26, 28 as well as piercing through the first ground-connection holes 30, 32, 34, 36 and the second ground-connection holes 38, 40, 42, 44. These guiding legs not only serve as a medium of connection and piercing, but also serve as a tool for securing the circuit sub-board 46. The computer system further includes a chipset 70 and memory module slots 58, 60, 62, 64, 66 and 68. The circuit sub-board 46 has such a shape that most of the signaling lines between the chipset 70 and the memory module slots 58, 60, 62, 64, 66 and 68 are covered. Because the fourth signaling layer is electrically connected with and close to the circuit sub-board 46, this is equivalent to increasing the surface area of the ground connections and power source. Hence, the signaling lines are in a stable environment shielded from external electromagnetic interference.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit sub-board for regulating constant power source and strengthening ground connections by connecting to a main circuit board, wherein said main board further includes a first power-source hole, a first ground-connection hole, a first power-source layer connected to said first power-source hole, and a first ground-connection layer connected to said first ground-connection hole, the circuit sub-board comprising:

a second power-source layer and a second ground-connection layer;

a plurality of second power-source holes formed through said circuit sub-board and electrically connected to said second power-source layer; and a plurality of second ground-connection holes formed through said circuit sub-board and electrically connected to said ground-connection layer;

wherein said circuit sub-board is secured and electrically connected to said main board via a plurality of guiding legs passing respectively through said first power-source holes to said second power-source holes and through said first ground-connection holes to said second ground-connection holes.

2. The circuit sub-board of claim 1, wherein said main board operates over 133 Mhz frequency at a bus speed.

3. The circuit sub-board of claim 1, wherein said main board further includes a chipset, a plurality of memory slots, and a plurality of signal lines there between, said circuit sub-board being mounted on said main board in a manner to substantially cover most of said signal lines between said chipset and said memory module slots.

4. The circuit sub-board of claim 1, wherein said circuit sub-board is a double-layered circuit board.

5. The circuit sub-board of claim 1, wherein said sub-board is assembled with said main board in a such a manner that said second ground-connection layer is closer to said main board than said second power-source layer.

6. A circuit board structure, comprising:

a main board, including:

a first power-source layer and a first ground-connection layer;

a plurality of first power-source holes formed through said main board and electrically connected to said first power-source layer;

a plurality of first ground-connection holes formed through said main board and electrically a connected to said first ground-connection layer; and a chipset and a plurality of memory module slots, wherein the chipset and the memory module slots are electrically connected to one another via a plurality of signal lines; and a circuit sub-board electrically connected to said main board, including:

a second power-source layer and a second ground-connection layer;

a plurality of second power-source holes formed through said circuit sub-board and electrically connected to said second power-source layer; and a plurality of second ground-connection holes formed through said circuit sub-board and electrically connected to said second ground-connection layer;

wherein said circuit sub-board is secured and electrically connected on said main board via a plurality of guiding legs passing respectively through said first power-source holes to said second power-source holes and through said first ground-connection holes to said second ground-connection holes, said circuit sub-board being placed on said main board in manner to further substantially cover said signal lines between said chipset and said memory module slots.

7. The circuit board structure of claim 6, wherein said main board operates over 133 Mhz frequency range at a bus speed.

8. The circuit board structure of claim 6, wherein said sub-board is a double-layered circuit board.

9. The circuit board structure of claim 6, wherein said sub-board is assembled with said main board in such a manner that said second ground-connection layer is closer to said main board than said power-source layer.

* * * * *